United States Patent
Deshmukh et al.

(10) Patent No.: US 7,122,125 B2
(45) Date of Patent: Oct. 17, 2006

(54) CONTROLLED POLYMERIZATION ON PLASMA REACTOR WALL

(75) Inventors: Shashank C. Deshmukh, San Jose, CA (US); Thorsten B. Lill, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 393 days.

(21) Appl. No.: 10/288,344

(22) Filed: Nov. 4, 2002

(65) Prior Publication Data

US 2004/0084409 A1 May 6, 2004

(51) Int. Cl.
*B44C 1/22* (2006.01)
(52) U.S. Cl. .............................. 216/63; 216/64; 216/71; 216/77
(58) Field of Classification Search ................... 216/63, 216/64, 67, 71, 77
See application file for complete search history.

(56) References Cited

U.S. PATENT DOCUMENTS

| | | | |
|---|---|---|---|
| 5,268,200 A | 12/1993 | Steger | 427/249 |
| 5,605,637 A | 2/1997 | Shan et al. | 216/71 |
| 5,622,565 A | 4/1997 | Ye et al. | 118/723 R |
| 5,641,375 A | 6/1997 | Nitescu et al. | 156/345 |
| 6,258,728 B1 * | 7/2001 | Donohoe et al. | 438/725 |
| 6,265,305 B1 * | 7/2001 | Tsou et al. | 438/628 |
| 6,274,500 B1 * | 8/2001 | Xuechun et al. | 438/706 |
| 6,322,716 B1 * | 11/2001 | Qiao et al. | 216/67 |
| 6,776,851 B1 * | 8/2004 | Singh et al. | 134/26 |
| 6,790,374 B1 * | 9/2004 | Ho et al. | 216/37 |
| 2002/0066532 A1 | 6/2002 | Shih et al. | 156/345.1 |
| 2002/0086118 A1 | 7/2002 | Chang et al. | 427/447 |
| 2002/0187629 A1 * | 12/2002 | Huang et al. | 438/624 |

* cited by examiner

*Primary Examiner*—Nadine Norton
*Assistant Examiner*—Binh X. Tran
(74) *Attorney, Agent, or Firm*—Law Offices of Charles Guenzer

(57) ABSTRACT

An integrated etch process, for example as used for etching an anti-reflection layer and an underlying aluminum layer, in which the chamber wall polymerization is controlled by coating polymer onto the sidewall by a plasma deposition process prior to inserting the wafer into the chamber, etching the structure, and after removing the wafer from the chamber, plasma cleaning the polymer from the chamber wall. The process is process is particularly useful when the etching is performed in a multi-step process and the polymer is used for passivating the etched structure, for example, a sidewall in an etched structure and in which the first etching step deposits polymer and the second etching step removes polymer. The controlled polymerization eliminates interactions of the etching with the chamber wall material, produces repeatable results between wafers, and eliminates in the etching plasma instabilities associated with changing wall conditions.

17 Claims, 3 Drawing Sheets

CONTROLLED POLYMERIZATION ON PLASMA REACTOR WALL

BACKGROUND OF THE INVENTION

1. Field of the Invention

The invention relates generally to semiconductor fabrication. In particular, the invention relates to plasma etching processes and chamber seasoning.

2. Background Art

The fabrication of modern semiconductor integrated circuits requires etching processes of carefully controlled chemistry and processing conditions in order to achieve anisotropic and selective etching of thin layers. One example involving silicon etching is illustrated in the cross-sectional view of FIG. 1. A silicon substrate 10 is covered with a thin gate oxide layer 12 having a composition of approximately $SiO_2$ and a thickness of about 1 to 10 nm. A polysilicon layer 14 is deposited over the gate oxide layer 12. It is intended to act as a lateral conductor so it is relatively thick, for example, 120 nm or more. An anti-reflection coating (ARC) 16 is deposited over the polysilicon layer 14. Its thickness and dielectric constant are chosen to prevent spurious reflections during the photolithography, but it is typically thinner than the polysilicon layer 14. There are several types of ARC. Dielectric ARC (DARC) is an inorganic composition, most typically, of silicon oxynitride (SiON) while BARC has an organic composition. A layer of photoresist is deposited over the ARC layer 16 and photographically patterned to form a photoresist mask 18 having a width corresponding to the desired gate width.

A multi-step plasma etching process is then used for form the structure of FIG. 2. In a break through etching step, the ARC layer 16 is etched selectively to the underlying polysilicon 14. A typical breakthrough etch for silicon oxynitride is based on fluorocarbon chemistry and reactive ion etching conditions. For example, the etching gas mixture for the breakthrough etch is a combination of carbon tetrafluoride (tetrafluoromethane, $CF_4$) and an inert gas such as argon (Ar) which is excited into a plasma at pressures of a few millitorr. The fluorocarbon plasma and in particular the fluorine radicals are effective at etching silicon oxynitride. The carbon content of the fluorocarbon forms a protective carbonaceous polymer, particularly on non-oxide portions such as the photoresist 18 and the underlying polysilicon 14. When the pedestal electrode supporting the wafer is RF biased to create a negative self-bias with respect to the adjacent plasma, the resultant reactive ion etching increases the etching rate. Further, the polymer is removed from the oxynitride exposed at the bottom of the hole being etched but continues to protect the sidewalls, thereby achieving anisotropic etching, which is desired even for the relatively thin ARC layer 16. The protective polymer produced by the fluorocarbon also deposits on the sidewalls or protective shields of the chamber. The sidewall and shields will be commonly referred to as a side portion of the reactor surrounding the processing space of the reactor. The pedestal electrode supporting the wafer being etched is adjacent to the processing space, typically on a lower side and the adjacent portions are somewhat higher and typically circularly symmetric about a central axis of the pedestal electrode.

For the organic BARC, on the other hand, a typical breakthrough recipe includes HBr and He—$O_2$. Typically for safety reasons, oxygen is included in an $O_2$/He mixture, also called He—$O_2$ and which is typically a premixture of 70% He and 30% $O_2$.

After breakthrough, a main etch directed to the polysilicon layer 14 is performed in which the etching conditions are changed to a silicon etch chemistry, such as hydrogen bromide (HBr), chlorine ($Cl_2$), oxygen ($O_2$), and $CF_4$. With wafer biasing, the bromine-based chemistry anisotropically etches silicon preferentially to the underlying oxide. The fluorocarbon content provides some polymerization and keeps the chamber walls relatively free of silicon oxide. The large amount of oxygen causes the already deposited sidewall polymer to be gradually removed during the main etch. The main etch, however, is selective to the underlying oxide layer 12, thereby producing the structure illustrated in FIG. 2 even if some overetching is done.

If the wafer is electrostatically chucked to the pedestal electrode, the dechucking process often includes an unbiased or relatively soft argon plasma to neutralize charge buildup on the wafer.

The process described above is subject to some unusual behavior. The breakthrough etch for BARC is usually terminated according to an endpoint detector that spectroscopically observes the species in the plasma, and in particular whether any of the underlying silicon is being etched. In fact, the etch is typically continued 40% after endpoint. The time required to reach endpoint provides a ready measure of the BARC etch rate. The etch rate is observed to strongly depend on the previous history of the chamber. Furthermore, when electron emission from the plasma is monitored during the main etch, the emission rate is some cases jumps significantly during the main etch. It is generally considered poor practice to dramatically change the plasma state during an etching even if endpoint detection is made.

Interactions of the silicon etching plasma with the anodized aluminum wall are believed to be responsible for high aluminum levels and other defects in the etched silicon.

Plasma dry cleaning of chambers is known, typically performed after long production cycles. Also chamber seasoning is known in which a thick polymer layer is deposited on the chamber walls. See, for example, U.S. Patent Application Publication 2002/0086118 A1 to Chang et al. and U.S. Pat. No. 5,268,200 to Steger.

SUMMARY OF THE INVENTION

An integrated etch process in which for every cycle of an etch cycle, a polymer coating is deposited onto walls or shields of the etch reactor before etching and the walls or shield are cleaned after etching. Preferably, no production wafer is present in the chamber during the deposition and cleaning. The integrated process is particular useful when the etching involves multiple steps, an earlier one of which is polymerizing and a later one of which removes the polymer. An example of the etching process a multi-step etch first of an anti-reflection coating and then of a polysilicon layer.

A dummy wafer may be placed on the pedestal electrode during polymer coating and chamber cleaning. Alternatively, the pedestal electrode is left bare. In the latter case, a ceramic electrostatic chuck is advantageously used.

DETAILED DESCRIPTION OF THE PREFERRED EMBODIMENTS

The variabilities described above in the breakthrough and main etches are believed to arise from relatively uncontrolled polymerization on the chamber sidewalls or its sidewall shields as the polymer is being deposited in the breakthrough etch but removed in the main etch. Whether a chamber sidewall or other chamber part is bare or covered by polymer will affect the plasma chemistry. For example, the presence of the carbonaceous polymer on the sidewall tends to scavenge oxygen from the main etch plasma while a bare chamber wall does not. The etch rate for the polysilicon main etch has been observed to change 10 to 20% when the chamber wall changes from being coated with polymer to being clean.

If there is more polymer deposited than is removed, that is, positive net polymer deposition, the polymer thickness builds up from one wafer to the next. Positive net polymerization is considered quite disadvantageous because the polymer thickness keeps building up until the polymer is thick enough that it flakes off from the chamber wall, creating serious and unacceptable particulate problems. Accordingly, it becomes necessary to clean the chamber walls, either by a manual wet clean or an extended plasma dry clean.

The other condition of no net deposition is preferred. The optimal condition would be exactly balanced polymer deposition and removal, that is, the last of the polymer is removed as the main etch is finishing. However, this situation is practically unobtainable. First, process conditions tend to vary significantly either from wafer to wafer or across the wafer, which is the reason for overetching, so that continued equality between deposition and removal is almost impossible to achieve. Secondly, deposition and removal conditions vary around the chamber sidewall. Accordingly, some portions may have zero net polymerization while others have positive net polymerization resulting in excessive polymer buildup.

A negative net polymerization situation obtains when the sidewall polymer remains only part way through the main etch. Thereafter, the sidewall portion is bare. However, this point is difficult to control, and in any case the transition results in a change of plasma state. When the polymer is removed from the sidewall portion midway through the main etch, the process becomes unstable for small process variations.

Even for the breakthrough etch, whether the chamber sidewall enters the breakthrough etch with or without a polymeric coating determines the plasma state at the beginning of the breakthrough etch but not the at the end.

The invention provides a more controlled etching process because of controlled polymerization of the chamber sidewall portion.

Figure 1:
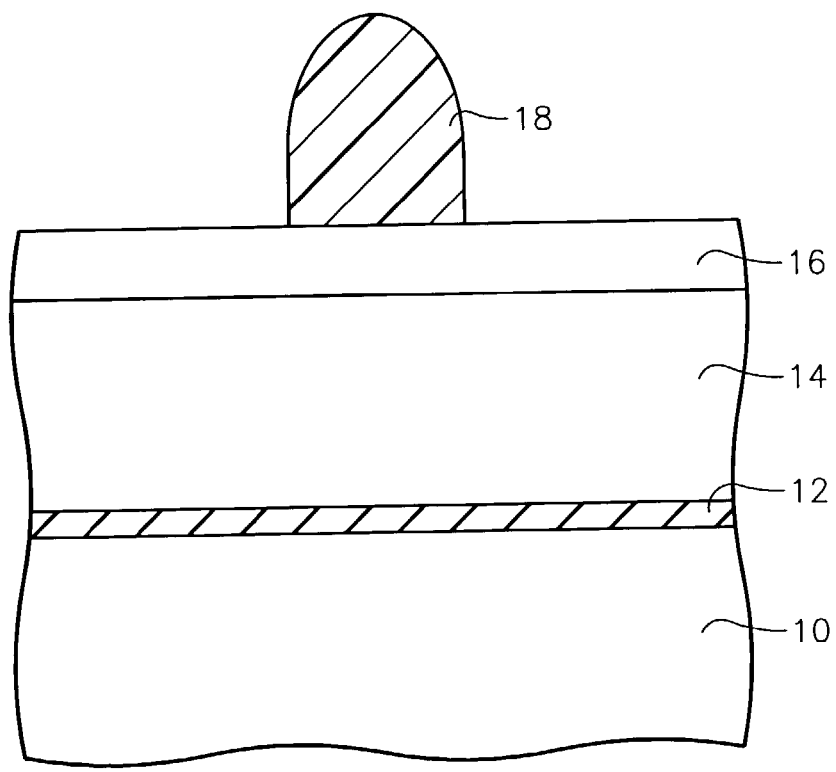
FIGS. 1 and 2 are cross-sectional view of a conventional aluminum metallization structure.
Figure 2:
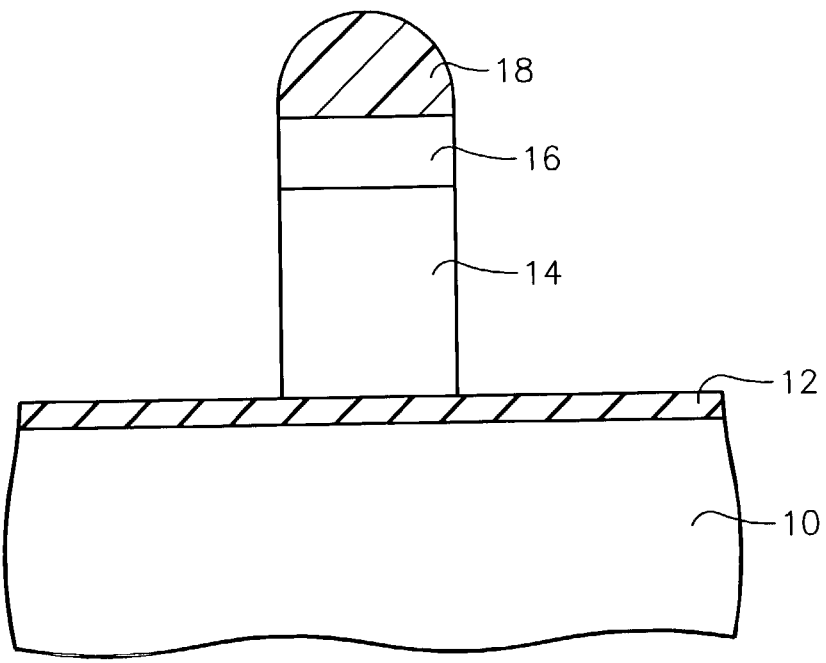
Figure 3:
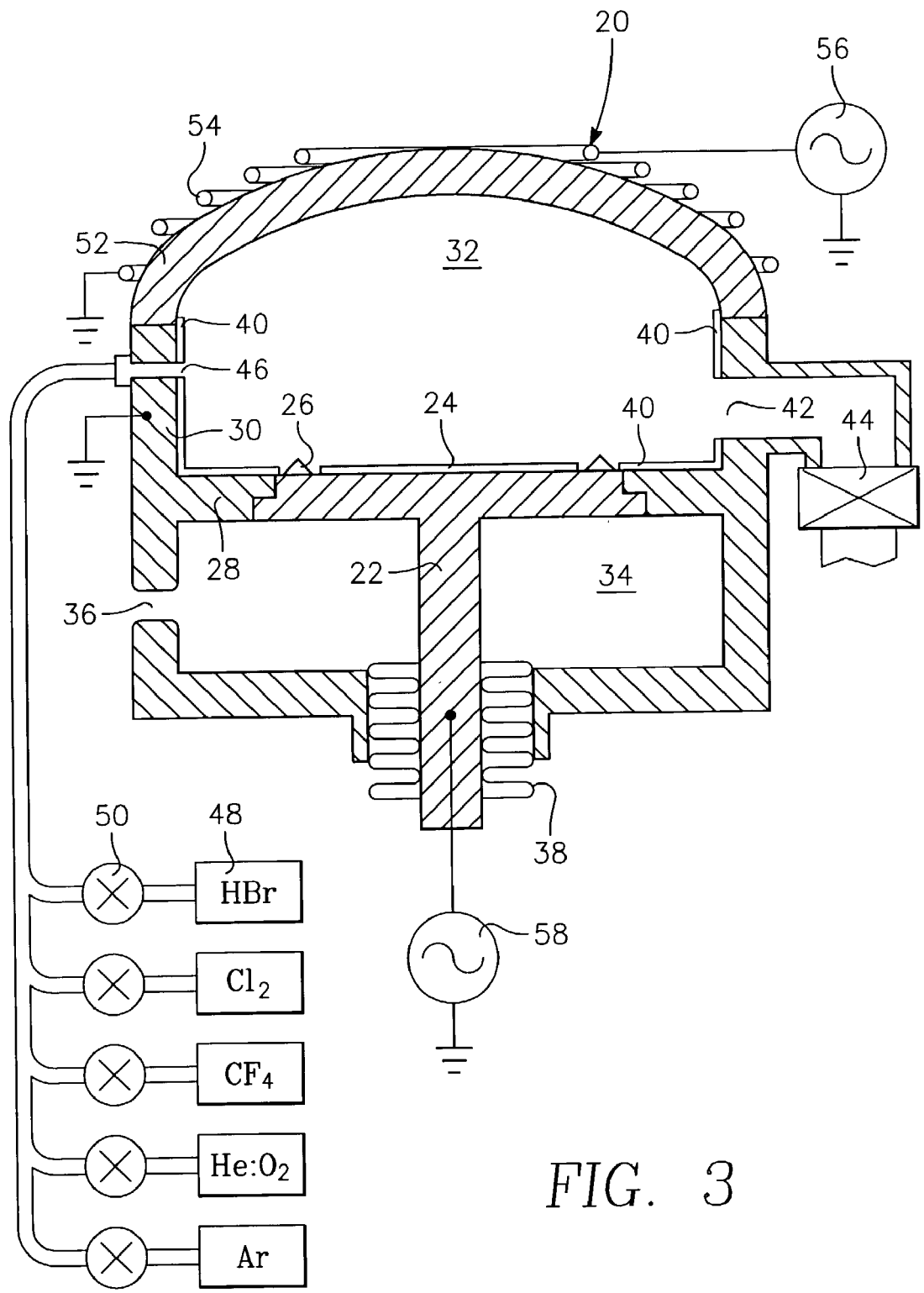
FIG. 3 is a cross-sectional view of a plasma etch reactor on which the process of the invention may be practiced.

An integrated etching process including the invention may be performed in many types of different etch reactors. A convenient single-wafer plasma etch reactor is the DPS Etch Reactor, available from Applied Materials, Inc. of Santa Clara, Calif. and illustrated schematically in the cross-sectional view of FIG. 3. The reactor 20 includes a vertically movable pedestal electrode 22 including an electrostatic chuck in its surface for holding a wafer 24 on its top surface. There are generally two types of electrostatic chucks in commercial use, those having a polyimide chucking surface and those having a ceramic surface. A ceramic electrostatic chuck is preferred in the cases where the chamber is plasma dry cleaned without a wafer disposed on the chuck since the organic polyimide is attacked by many reactive plasmas, particularly those directed to cleaning. A plasma ring 26 also rests on the pedestal surface both to guide the plasma and to protect the outer periphery of the electrostatic chuck, which may be composed of polyimide. Unillustrated cooling water is flowed through the pedestal electrode 22 to maintain a controlled cathode temperature. Helium is flowed as a thermal transfer gas into a thin cavity in the surface of the pedestal electrode 22 underlying the wafer 24 to effectively transfer heat from the wafer 22 to the pedestal electrode 22 and its cooling water. Temperature can more rapidly be controlled by changing the helium pressure rather than changing the temperature of the chilled water.

The pedestal 22 is raisable to engage and seal, but be electrically isolated from, a dividing wall 28 of a grounded plasma reaction chamber 30 conveniently formed of anodized aluminum, although a material such as of boron carbide may be advantageously coated on the interior of the chamber. The dividing wall 28 separates an upper chamber 32, in which the plasma processing occurs, from a lower chamber 34. A sealable valve slit 36 formed in the lower chamber 34 allows a robot to move a paddle bearing the wafer through the slit 36 when the pedestal 22 is in the lower position to thereby transfer the wafer between the exterior of the chamber and the pedestal 22. The chamber wall 30 is connected to the pedestal 22 through a flexible bellows 38 allowing the pedestal 22 to be moved vertically while maintaining the vacuum seal within the reaction chamber 20.

Many advanced etch chemistries deposit a significant amount of polymer. To reduce the need for cleaning the polymer from the chamber wall, particularly if a wet cleaning process is being used, some etch reactors include an electrically grounded sidewall shield 40 positioned inside the upper chamber 32 next to the chamber 30 and dividing wall 28. Rather than an in situ wet clean of the chamber when the polymer has accumulated to an excessive thickness, the dirty shield 40 is instead replaced with a clean one.

The upper chamber 32 is pumped through a pumping port 42 by a vacuum system 44, which maintains a predetermined pressure in the upper chamber 42 during wafer processing. The pumping system is typically operated at maximum capacity, but a butterfly valve has its position controlled in a feedback loop from a chamber pressure sensor to attain the programmed chamber pressure. Processing gas is supplied into the upper chamber 32 through multiple nozzles 46 arranged around the circumference of the upper chamber 32 above the pumping port 42. The nozzles 46 are connected to gas supplies 48 through respective mass flow controllers 50, which control the composition of the gas mixture. The chemical nature of those gases and their flow rates are subjects of this invention.

A dielectric dome 52 is sealed to the reaction chamber 20 at the top of the upper chamber 32, and an RF inductive coil 54 wrapped around the dome 52 is powered by a controllable RF power supply 56 generating RF power at, for example, between 2 and 4 MHz to generate plasma in the plasma source region separated from the wafer 24, hence the name of decoupled plasma source. Another controllable RF power supply 58 generating RF power at, for example, 13.56 MHz is connected to the pedestal electrode 22 through an unillustrated capacitive coupling circuit to electrically bias the electrode 22 and hence the surface of the wafer 24. An RF-biased, DC-isolated electrode in the presence of a plasma will become negatively DC biased. The controllable negative DC voltage on the pedestal electrode 42 is used to control the energy and directionality of positively charged plasma ions incident upon the wafer 24. The power supplied to the RF inductive coil 54 will be referred to as source power, and that supplied to the pedestal electrode 22 will be referred to as bias power.

Figure 4:
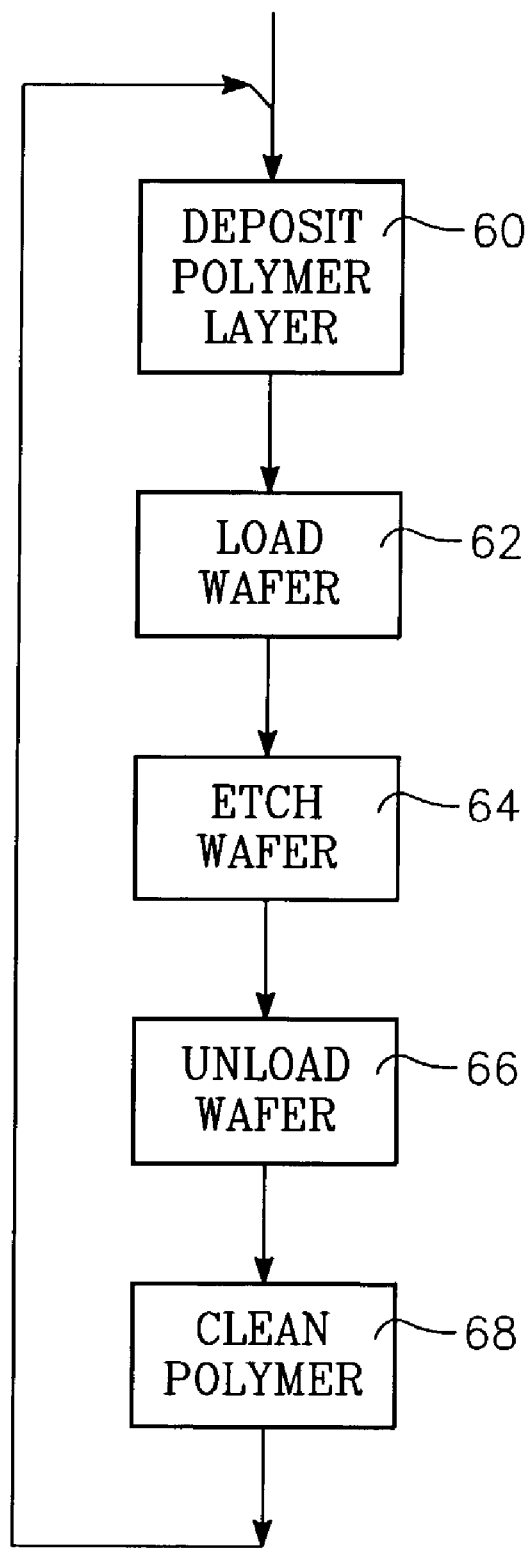
FIG. 4 is a flow diagram of an integrated etch processing according to one embodiment of the invention.

An etching cycle included within the invention is illustrated in the flow chart of FIG. 4. In step 60 at the beginning of the cycle and without the production wafer in the chamber, a polymeric layer is deposited such that about 5 to 10 nm of polymer is deposited on most of the chamber walls or wall shields exposed to the plasma. A typical deposition recipe and exemplary extended ranges for use in the DPS etch reactor are summarized in TABLE 1.

TABLE 1

|  | Typical | | Range | |
| --- | --- | --- | --- | --- |
|  | Deposition | Clean | Deposition | Clean |
| $CF_4$ Flow (sccm) | 30 | | 10–100 | |
| HBr Flow (sccm) | 70 | | 10–100 | |
| He—$O_2$ Flow (sccm) | | 45 | | 50–300 |
| Pressure (mTorr) | 4 | 10 | 2–30 | 5–30 |
| Source Power (W) | 500 | 1000 | 250–1000 | 400–1500 |
| Bias Power (W) | 0 | 5 | 0 | 0–20 |

The source power is the RF power applied to an inductive coil wrapped around a curved dome. The bias power is the RF power applied through a capacitive coupling circuit to the pedestal electrode supporting the wafer. Other seasoning recipes, which really amount to chemical vapor deposition, are possible. However, the components listed above are already being used in the breakthrough and main etching steps described before so additional plumbing and control elements are not required. The hydrogen bromide is used as a fluorine scavenger since carbon tetrafluoride does not readily deposit a carbonaceous polymer. Other fluorine-scavenging gases are known such as hydrogen gas. Hydrofluorocarbons such as $CHF_3$, $CH_2F_2$, and $CH_3F$ similarly provide hydrogen. Hydrogen-free fluorocarbons such as $C_4F_6$ with a high C/F ratio also deposit polymer under selected conditions. Furthermore, hydrocarbon plasmas such as of ethylene ($C_2H_2$) readily deposit a polymer.

After the chamber has been seasoned, in step 62 a production wafer is loaded into the etch chamber and placed on the pedestal electrode. In step 64, the wafer is etched. Although the details of the wafer etching are not crucial to the invention, the seasoning of the invention is particularly useful when the initial portion of the etch recipe results in net polymer deposition on the chamber walls or the shields protecting them. The chamber walls and the shield will be collectively referred to as a sidewall portion, which surrounds the plasma from which the polymer is being deposited onto the exposed sidewall portion. The seasoning assures that the walls remain uniformly covered with polymer during at least the first portion of the etching. The invention has been applied to the previously described multi-step etching process in which the first part results in net polymer deposition on the chamber walls and a following part removes the polymer from the wall. With the chamber wall being deposited and cleaned every cycle, the inclusion of a fluorocarbon during the polysilicon etch is no longer so important although it is still effective at reducing microloading effects which produce different etching rates according to the density of the open mask area.

After the wafer has been etched, it is unloaded from the etch chamber in step 66. The unloading may include the previously described dechucking sequence in the presence of an argon plasma. In step 68, the polymer deposited on the chamber walls or shields is cleaned in what amounts to an ashing step similar to what is performed to remove residual photoresist. An example of an oxygen-based ashing recipe performed in the DPS chamber is given in TABLE 1. The cleaning etches and completely removes the carbonaceous polymer from the chamber walls. The cleaning step may be controlled by an end point detector, for example, monitoring CO emissions at 483 nm. When the 483 nm emission significant falls, the carbon-based polymer has all been removed.

After the chamber cleaning step 68, the process repeats for the next production wafer. It is seen that for most wafer cycles, the cleaning step 68 is immediately followed by the seasoning step 60. The plasma may be continued between the two steps 68, 60 with only the gas feeds, powers, and possibly pressure being changed between the steps. Even for the first wafer in a production cycle, it may be advantageous to perform the chamber cleaning step 68 before the initial seasoning step 60.

If the seasoning and cleaning steps 60, 68 are performed with no wafer in the chamber then the pedestal electrode is both deposited with the thin polymer layer and then subjected to etching in the cleaning step. The cleaning step is particularly troublesome if a polyimide electrostatic chuck is being used since the etch cleaning chemistry is intended to etch a carbon-based polymer, which polyimide also is. Thus, unless the cleaning step is tightly confined, it will etch the polyimide chuck which relies on a thin polyimide surface layer for electrostatic chucking. Clearly, a substantial amount of etching of the polyimide should be avoided in a production environment. One way to avoid etching of the polyimide chuck is to load a dummy wafer onto the electrostatic chuck prior to the cleaning step 68 and to remove it after the seasoning step 60. A dummy wafer is a sacrificial wafer not intended for use as a production wafer and which can be used many times. Although a dummy wafer is effective at protecting the electrostatic chuck, transferring and storage of the dummy wafer present significant traffic loads on what is intended to be high throughput equipment. An alternative is to use a non-organic electrostatic chuck, preferably formed of a ceramic such as one having a surface of aluminum nitride or other material resistant to a carbon etching step.

It is possible that the second etching step, the main etch described above, reliably removes all the polymer from the chamber wall and the change is not significant. In this case, the chamber cleaning step is not required before polymer is coated in the seasoning step.

It is also possible that the second etching step also results in net polymerization. In this case, the chamber cleaning step prevents the polymer from building up over multiple cycles while the season step provides continuous polymer coverage during the entire etch process.

Although the invention has been described as part of a silicon etching process, other types of etching, for example, of aluminum and other metal or oxide and other dielectric would benefit from the additional control of chamber wall conditions provided by the invention.

The controlled polymerization of the invention allows a more predicable and controllable overall etching sequence. It eliminates the interaction of the etching plasma with the chamber wall material since the plasma sees only the deposited polymer and not the wall material. As a result, the etch will not be subject to defects generated by the plasma interacting with the wall material, for example, the anodized aluminum. Since the controlled polymer deposition is performed before every wafer, the etch process will exhibit repeatable results from wafer to wafer with no first-wafer effects. Because the polymer stays on the walls until the wafer etching is completed, there are no plasma instabilities associated with changing conditions on the chamber walls. The invention further permits a significant reduction in the need for chamber wet cleaning. The in situ cleaning for every wafer also ameliorates the particle problem since polymer layers may be removed before they accumulate to a dangerous thickness. Nonetheless, the invention can be implemented with only minor additions to existing etching processes and equipment.

The invention claimed is:

1. An integrated plasma etch process performed in a single etching reactor, comprising a plurality of etching cycles for processing sequential ones of a plurality of production substrates disposable on a pedestal adjacent a processing space of said reactor, wherein a side portion of said reactor surrounds said processing space, each etching cycle of said process comprising the following steps performed in the stated order of:
   while no production substrate is disposed on said pedestal, depositing from a first gas mixture admitted into said chamber a first polymeric coating onto said side portion;
   loading a sequential one of said plurality of production substrates onto said pedestal in said reactor adjacent said processing space;
   etching said sequential one of said plurality of production substrates in an etching process that deposits a second polymeric coating onto said side portion, wherein said etching step includes
      a first etching substep in which a third polymeric coating, which is at least a part of the second polymeric coating, is deposited onto said side portion, and
      a second and subsequent etching substep in which said third polymeric coating is etched from said side portion;
   unloading said sequential one of said plurality of production substrates from said pedestal; and
   while no production substrate is disposed on said pedestal, cleaning said side portion of said reactor such that said second polymeric coating is removed from said side portion.

2. The process of claim 1, wherein said cleaning step includes exciting a gas containing oxygen into a plasma.

3. The process of claim 1, wherein no substrate is disposed on said pedestal during said depositing and cleaning steps.

4. The process of claim 1, wherein a dummy substrate is disposed on said pedestal during said depositing and cleaning steps.

5. The process of claim 1, wherein equal numbers of the depositing, etching and cleaning steps are performed during a time span during which the plurality of etching cycles are performed.

6. The process of claim 1, wherein said etching process etches a metal deposited on said sequential one substrate.

7. The process of claim 6, wherein said metal is aluminum.

8. The process of claim 1, wherein said depositing step includes exciting a gas containing carbon and fluorine into a plasma.

9. The process of claim 8, wherein said gas comprises carbon tetrafluoride.

10. The process of claim 8, wherein said gas is additionally used in said etching step.

11. The process of claim 8, wherein a pedestal is not electrically biased during said depositing step.

12. The process of claim 8, wherein said pedestal comprises a pedestal electrode which is electrically biased during said cleaning step.

13. An integrated silicon etch process, comprising the steps performed in a plasma reactor for each of a plurality of sequentially processed production wafers:
   depositing from a plasma of a first gas mixture including $CF_4$ and HBr a first polymeric coating onto a part of said reactor;
   a first etching step of etching a first layer overlying a silicon layer in one of said production wafers with a plasma of a second gas mixture, said first etching step causing a second polymeric coating to deposit on said part;
   a second etching step of etching said silicon layer with a plasma of a third gas mixture comprising bromine; and
   cleaning said part with a plasma of a fourth gas mixture comprising oxygen.

14. The process of claim 13, wherein said one of said production wafers is loaded into said reactor between said depositing and first etching steps and is removed from said reactor between said second etching and cleaning steps.

15. The process of claim 13, wherein said first layer is an anti-reflection coating.

16. The process of claim 15, wherein said first layer comprises an organic material, said second gas mixture comprises hydrogen bromide and oxygen, and said third gas mixture comprises hydrogen bromide, chlorine gas, and oxygen gas.

17. The process of claim 15, wherein said first layer comprises silicon oxynitride, said second gas mixture comprises a fluorocarbon, and said third gas mixture comprises hydrogen bromide, chlorine gas, and oxygen gas.

* * * * *